United States Patent [19]

Dickie et al.

[11] Patent Number: 4,596,353

[45] Date of Patent: Jun. 24, 1986

[54] LEAD TINNING SYSTEM

[75] Inventors: John Dickie, Hemmingford; William H. Down, Brossard; Armin Rahn, St. Jean-sur-Richelieu, all of Canada

[73] Assignee: Electrovert, Ltd., Toronto, Canada

[21] Appl. No.: 635,820

[22] Filed: Jul. 30, 1984

[51] Int. Cl.[4] .......................... B23K 1/08; B23K 1/12
[52] U.S. Cl. ........................................ 228/18; 228/37
[58] Field of Search ............... 228/18, 37, 43, 180.1; 29/729, 742, 822, 823, DIG. 73; 118/74, 500, 503; 198/733, 735

[56] References Cited

U.S. PATENT DOCUMENTS

| | | | |
|---|---|---|---|
| 3,482,755 | 12/1969 | Raciti | 228/180.1 X |
| 3,595,374 | 7/1971 | Whitfield | 198/733 X |
| 3,765,591 | 10/1973 | Cook | 228/37 X |
| 3,825,994 | 7/1974 | Coleman | 228/37 X |
| 4,018,327 | 4/1977 | Goodman et al. | 198/733 X |
| 4,246,840 | 1/1981 | Yoshino et al. | 198/735 X |
| 4,250,988 | 2/1981 | Miaskoff | 198/733 X |

FOREIGN PATENT DOCUMENTS 128051  8/1982  Japan ........................... 228/43

Primary Examiner—Nicholas P. Godici
Assistant Examiner—M. Jordan
Attorney, Agent, or Firm—Darby & Darby

[57] ABSTRACT

Apparatus for treating electronic components comprises a frame, a lower track mounted on the frame for supporting the components, and an upper track mounted on the frame in a normal operating position above and in spaced-apart parallel relationship to the lower track. The lower and upper tracks define therebetween a path along which the components can pass for treatment. Pusher fingers are provided each having a portion which extends substantially horizontally in such a manner as to be insertable between the tracks and engageable with individual ones of the components. A drive is mounted on the frame for propelling the fingers. The components are held captive between the lower and upper tracks, and the fingers engage individual ones of the components and propel them along the path.

25 Claims, 4 Drawing Figures

LEAD TINNING SYSTEM

BACKGROUND OF THE INVENTION

This invention relates to the treatment of electronic components and the like and, more particularly, to a novel and highly effective lead tinning system which propels electronic components along a path where they receive various treatments such as fluxing, tinning (soldering), washing and drying.

Electronic components such as semiconductor devices must in many cases be given various treatments in order to render them suitable for movement in channels of trade and for their intended end uses.

One type of electronic component which is treated in this manner is known in the industry as a Dual In-Line Package (DIP). Such DIPs come in various sizes: the length, width and thickness of the plastic or ceramic rectangular body portion may all vary independently. A plurality of "legs" (leads or terminals) emerge from the sides of the body portion and are normally bent so that the legs on either side lie in a plane which is generally parallel to the side of the body portion from which the legs emerge and perpendicular to the top and bottom surfaces of the body portion.

As the DIPs are transported along a track through various treatment stations, they can be arranged so that the legs point down, in which case they are referred to as "live bugs", or up, in which case they are referred to as "dead bugs". The preferred arrangement may depend on the intended treatment.

Conventional apparatus for propelling such DIPs in the "live" position through various treatment stations is exemplified by the disclosure of a Japanese patent laying open No. 128051/1982. That documents discloses (A) a supply station, (B) a flux station, (C) a soldering station, and (D) a washing and drying station, together with a lower rail and a pair of upper guide members which extend from one station to another to facilitate movement of the DIPs. The purpose of the upper guide members is to keep the DIPs from falling off the lower rail as they move along the rail and receive various treatments. The lower rail has different shapes in the several stations, depending on the nature of the treatment effected at each station. The upper guide members have the form of a pair of spaced-apart wire-like bars engageable with the top of the DIPs in stations (A), (B) and (D); and they have the form of a pair of spaced-apart bars of L-shaped cross-section engageable each with the top and one side of the DIPs in station (C).

Feed pins are arranged at regular intervals for propelling groups of DIPs along the lower rail through the various treatment stations. The feed pins are attached to an endless conveyor and extend vertically downward between the pair of upper guide members in order to engage and propel the DIPs.

There are some serious drawbacks to this conventional apparatus. First, as indicated above, DIPs come in different thicknesses. While all of the DIPs receiving treatment in a given run are likely to be of the same thickness, the DIPs treated in successive runs may vary greatly in thickness. The conventional apparatus described above cannot easily be modified or adapted to handle DIPs of different thickness.

In particular, there is no easy way to adjust the separation between the upper guide members and the lower rail. This is a serious problem, since any attempt to treat DIPs of substantially increased thickness will tend to cause binding of the DIPs between the upper guide members (even if they have some flexibility) and the lower rail; and any attempt to treat DIPs of substantially reduced thickness will deprive the DIPs of the restraint intended to be imposed by the upper guide members and will therefore result in DIPs becoming dislodged from the lower rail as a result of encountering a standing wave in the solder pot, a blast of air in the drying section, etc.

Moreover, even if the prior apparatus were somehow modified to permit easy adjustment of the separation between the upper guide members and the lower rail, the apparatus would be less than satisfactory, because the vertically-extending feed pins must either be excessively long, in order to be engageable with DIPs of all thicknesses, or be positionally adjustable in a vertical direction. The latter type of adjustment is unduly complicated, especially since the pins are mounted on a movable endless conveyor.

Another drawback of conventional apparatus stems from the fact that DIPs come in different widths. The conventional apparatus described above cannot easily be modified or adapted to handle DIPs of different widths.

It is important that the width of the lower rail be reasonably related to the width of the DIPs transported on the rail. If the DIPs are narrower than the rail, and it is desired to propel them along the rail in the "live" position (for example, in order to tin the legs), the legs will not fit over the rail, and the process becomes unworkable.

On the other hand, if the DIPs are too much wider than the rail, they can slip sideways or become cocked on the rail to the point where they are unacceptably positioned for purposes of correct treatment, or even slip sideways to the point where they topple off the rail.

In the conventional apparatus, access to the lower rail for the purpose of replacing it with another rail of different width is awkward, since no provision is made for conveniently displacing the upper guide members. In the absence of such provision, it is necessary to custom-build the apparatus to accommodate each size of component or to resort to partial disassembly of the apparatus merely in order to have access to the lower rail. This is expensive in terms not only of the direct labor involved but also of the production lost because of downtime of the apparatus.

SUMMARY OF THE INVENTION

An object of the invention is to remedy the problems of the prior apparatus noted above. In particular, an object of the invention is to provide apparatus for treating electronic components and the like which is adapted to accommodate components of different sizes and shapes with only minimal adjustments and downtime of the apparatus.

The foregoing and other objects are attained in accordance with the invention by providing a frame on which is mounted a lower track for supporting electronic components to be treated. An upper track is mounted on the frame in a normal operating position above and in spaced-apart parallel relation to the lower track. The lower and upper tracks define therebetween a path along which the components can pass for treatment.

A plurality of fingers is provided, each having a portion which extends substantially horizontally in such a manner as to be insertable between the tracks and engageable with individual ones of the components. A drive is mounted on the frame for propelling the fingers.

The components are held captive between the lower and upper tracks, and the fingers engage individual ones of the components and propel them along the path.

BRIEF DESCRIPTION OF THE DRAWING

A better understanding of the invention can be gained from a consideration of the following detailed description of the preferred embodiments thereof, in conjunction with the appended figures of the drawing, wherein.

DESCRIPTION OF THE PREFERRED EMBODIMENTS

Figure 1A:
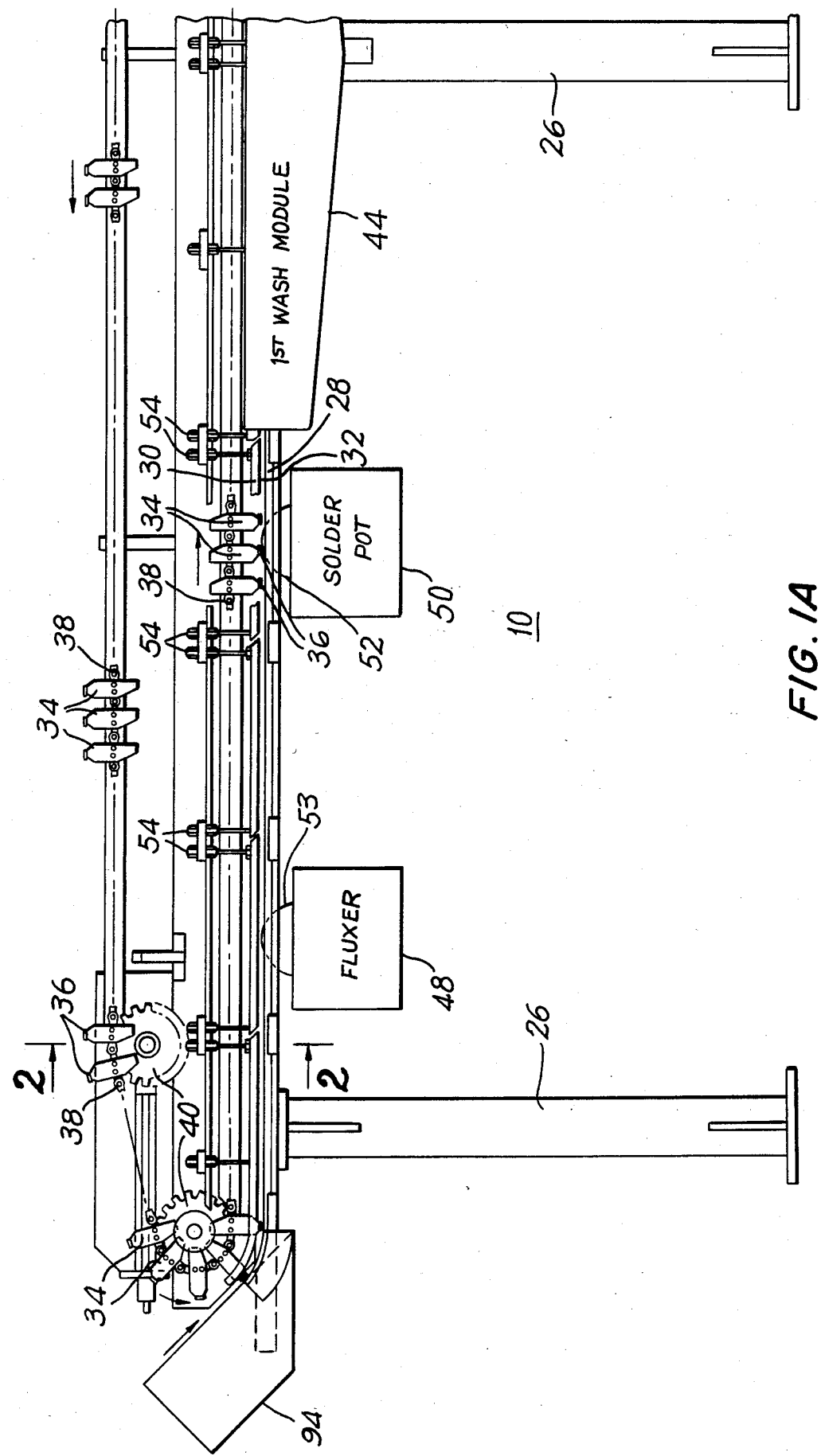
FIGS. 1A and 1B together, when arranged side-by-side with FIG. 1A to the left of FIG. 1B, are a view in side elevation showing somewhat schematically apparatus constructed in accordance with the invention.
Figure 1B:
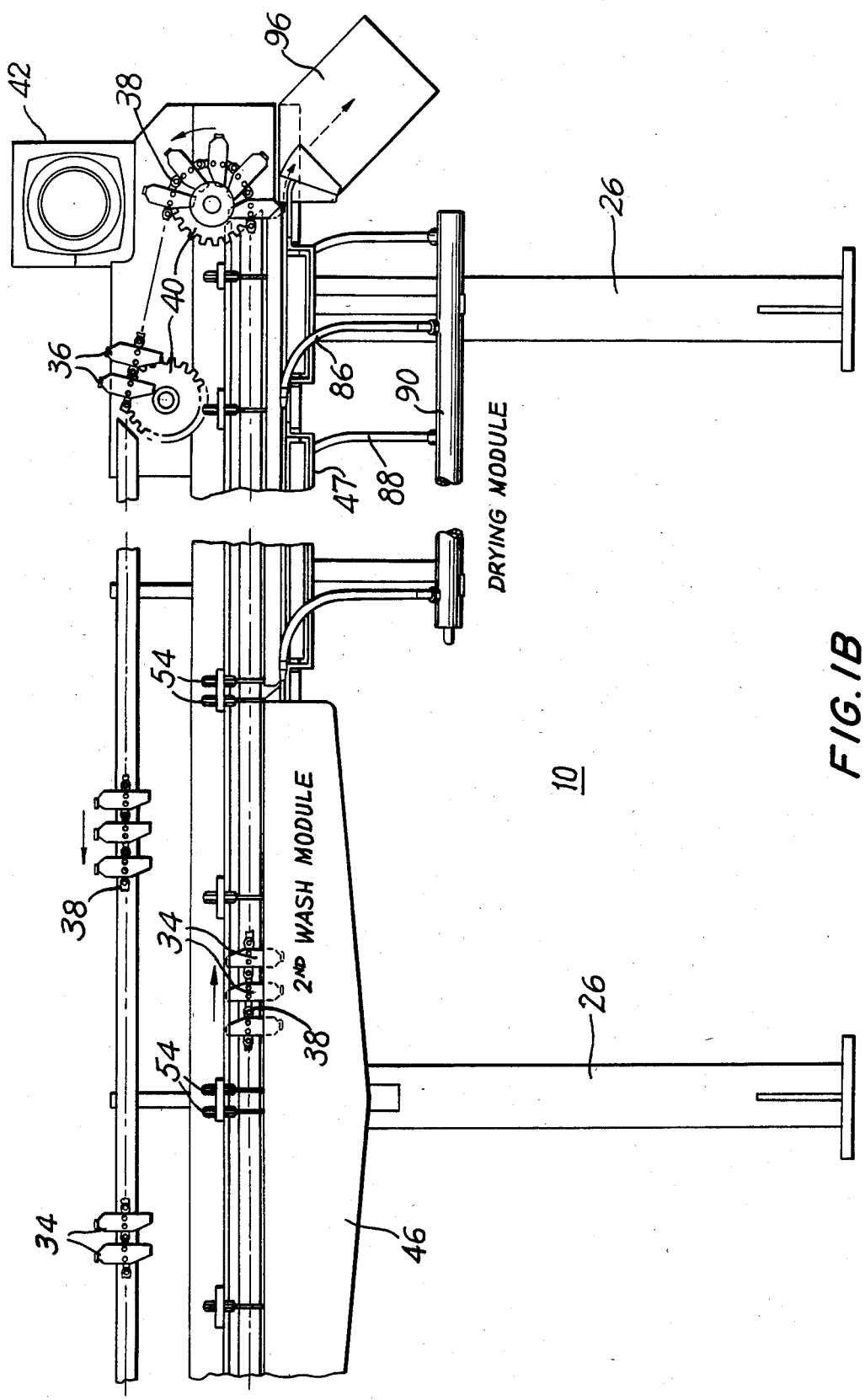

FIGS. 1A and 1B together show apparatus 10 constructed in accordance with the invention. The apparatus is specially adapted for treating electronic components, particularly DIPs 12 of the type illustrated in FIGS. 2 and 3. Each component or DIP 12 has a body portion 14 which is typically made of plastic or ceramic material and has the shape of a rectangular parallelepiped. The components or DIPs 12 have a plurality of legs 16 which emerge from the sides 18 of the body portion 12 and are normally bent so that the legs 16 on either side of the body portion 14 lie in a plane which is generally parallel to the side 18 of the body portion 12 from which the legs 16 emerge and perpendicular to the top and bottom surfaces 20 and 22, respectively, of the body portion 14. The number of legs 16 can vary. In a typical DIP 12 there may be, for example, eight legs 16 on each side 18 of the body portion 14.

Figure 2:
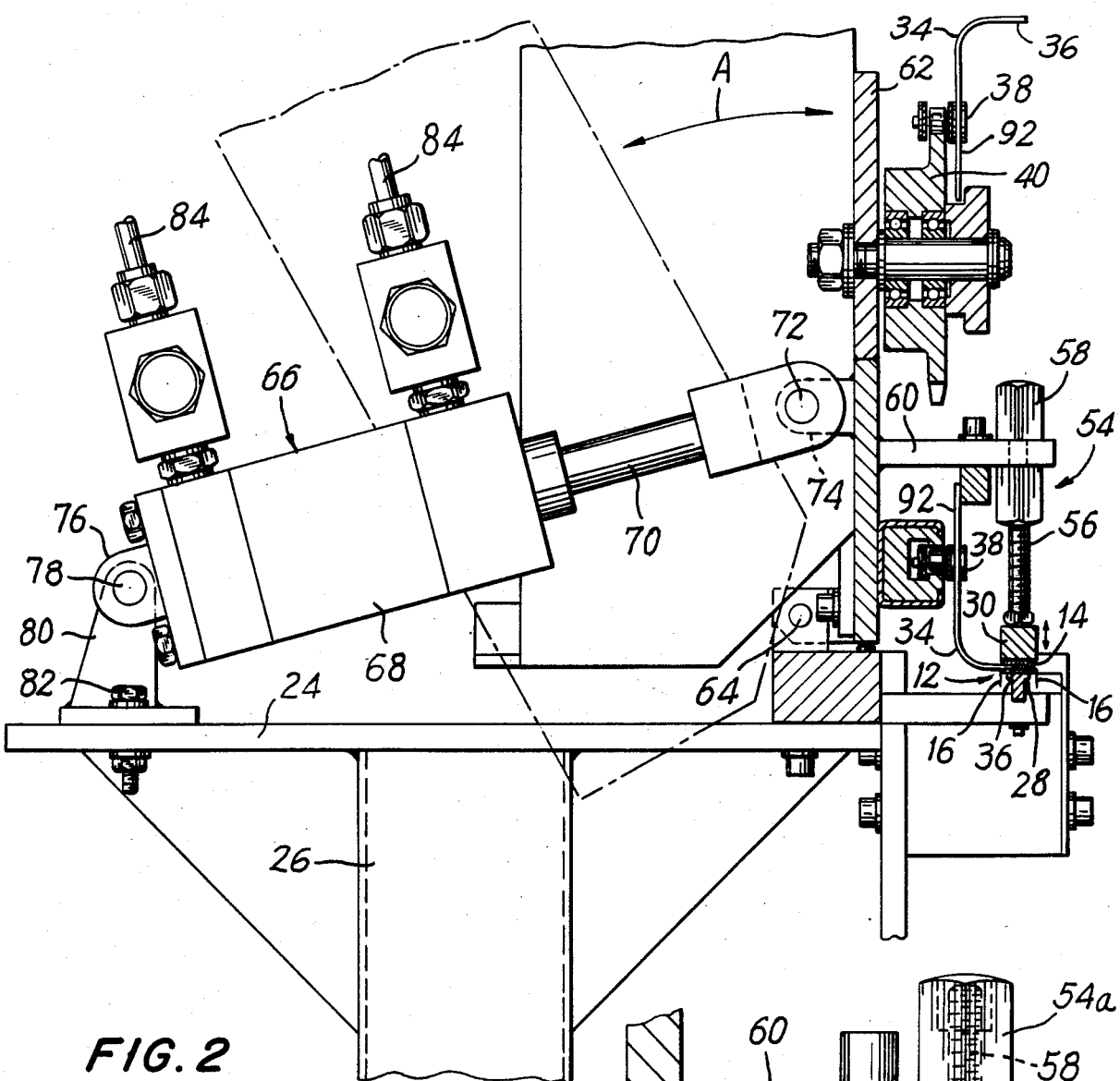
FIG. 2 is a sectional view on a larger scale, taken along the line 2—2 of FIG. 1A and looking in the direction of the arrows.
Figure 3:
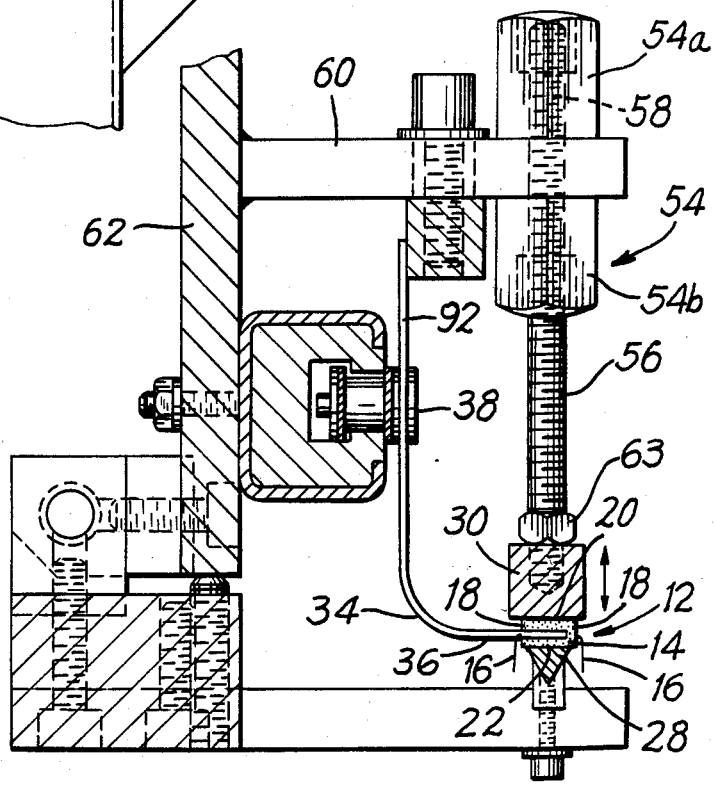
FIG. 3 is a fragmentary view corresponding to FIG. 2, drawn on a still larger scale, and showing a modification thereof appropriate to a different part of the apparatus.

The DIPs 12 are shown in the "live" position in FIGS. 2 and 3, in order to facilitate treatment of the legs, particularly fluxing and soldering thereof.

The apparatus 10 may be used in combination with other apparatus (not shown), including particularly an etching module upstream thereof for precleaning and deoxidizing the legs 16. The apparatus 10, which is shown schematically in FIGS. 1A and 1B, comprises a frame 24 (FIG. 2), including vertical stanchions 26 (FIGS. 1A, 1B and 2). A lower track 28 (FIGS. 2 and 3) is mounted on the frame 24 for supporting the DIPs 12. An upper track 30 is mounted via intermediate structure described below on the frame 24 in a normal operating position above and in spaced-apart parallel relation to the lower track, as FIGS. 1A, 2 and 3 best show. The lower and upper tracks 28 and 30 define therebetween a path 32 along which the DIPs 12 can pass for treatment. Because of the open construction, the components 12 are visible from a position alongside the apparatus 10 as they move along the path 32.

A plurality of fingers 34 shown in each figure is provided for propelling the DIPs 12 along the path 32. Each finger 34 has a portion 36 which extends substantially horizontally in such a manner as to be insertable between the tracks 28 and 30 and engageable with individual ones of the DIPs 12 while usually avoiding contact with the solder (see below). The fingers 34 are preferably made of a noncorroding material such as titanium.

A drive such as a chain 38 is mounted via structure described below on the frame 24 for propelling the fingers 34. The chain 38 can be similar to a bicycle or motorcycle chain. However, the chain 38 is preferably a roller type, whereas a bicycle chain, for example, is usually a bush type. The chain 38 is wound around sprockets 40 one of which is powered, for example by a D.C. drive motor 42 (FIG. 1B) through appropriate reduction gearing (not shown).

The DIPs 12 are held captive between the lower and upper tracks 28 and 30, and the fingers 34 engage individual ones of the DIPs 12 and propel them along the path 32. The pitch of the fingers 34 is easily changeable (by connecting the fingers to different selected links of the chain 38) to suit components 12 of different lengths.

The lower track 28 has for at least a portion of its extent a substantially T-shaped cross section, as FIG. 2 shows. This cross section is appropriate for certain treatments, for example the treatment effected in a first wash module or section 44 (FIG. 1A), a second wash module or section 46 (FIG. 1B), and a drying module or section 47 (FIG. 1B).

The lower track 28 has for at least a portion of its extent a substantially V-shaped cross section, as FIG. 3 shows. This cross section, which is both strong and inexpensive, is appropriate in certain parts of the apparatus 10, for example a flux section or fluxer 48 and a solder pot or solder section 50, both shown in FIG. 1A. The V-shaped cross section permits the flux or solder to envelop and coat (tin) the legs 16, whereas a T-shaped cross section might interfere with the flow of flux or solder around the upper reaches of the legs 16. For the purpose of tinning the legs 16, the solder pot 50 incorporates conventional means (not shown) for generating a standing wave 52. Similarly, the fluxer 48 incorporates means (not shown) for generating a standing wave 53.

The liquid flux is preferably heated to about 160° F. or higher so that it effects a certain preheating of the DIPs 12. An optional intermediate hot air blast (not shown) removes residual flux from the DIPs 12 as they leave the fluxer 48 and provides additional preheating. Supplemental heating measures (not shown) may also be employed for that purpose, so that the DIPs 12 are heated to 200° to 280° F. as measured on the body portion 14. The DIPs 12 may thus be gradually warmed to reduce thermal shock in the soldering station 50, where the temperature in the solder wave is typically about 450° F.–500° F.

The solder module performs the "tinning" of the legs or terminals 16. Soft solders, such as tin-lead alloys, pure tin, or other appropriate compositions, are used. The solder module 50 may optionally be equipped with means (not shown) for applying a mixture of flux at the entry and/or exit.

In accordance with the invention, the apparatus 10 further comprises adjusters 54 shown in each figure operatively associated with the frame 24 and at least one of the tracks 28 and 30 for adjusting the separation between the tracks 28 and 30, whereby components such as DIPs 12 of different thicknesses can be accommodated. In the preferred embodiment of the invention, the adjusters 54 are connected to the upper track 30, as shown in the figures.

The adjusters 54 comprise separate nuts 54a and 54b on a shaft 56 formed with a thread defining a helix about a vertical axis. The shaft 56 is screwed into a bore 58 mounted on a flange 60 which is connected as by welding to a backplate 62. The shaft 56 is also screwed into the upper track 30 and locked into place with respect thereto by a nut 63, as FIG. 3 shows.

Accordingly, turning of the adjusters 54, including loosening of one or both of the nuts 54a and 54b, enables mutual movement of the shaft 56 through the flange 60 and effects adjustment of the elevation of the upper track 30. When the shaft 56 is correctly positioned, the nuts 54a and 54b are retightened. A plurality of adjusters 54 is provided along the length of the upper track 30. The upper track 30 has a certain flexibility, so that it can be flexed if necessary to make it exactly parallel to the lower track 28. Moreover, the entire upper track 30 can be raised or lowered by suitable manipulation of all of the adjusters 54.

The backplate 62 is mounted movably in such a manner that the structure supported thereby, including the chain 38, sprockets 40, flanges 60, adjusters 54, fingers 34, and upper track 30, can be displaced to uncover the lower track 28, thereby permitting access to the lower track 28 for the purpose of cleaning or of substituting another lower track having a different width suitable to accommodate DIPs 12 of different widths.

More particularly, the backplate 62 has a pivot mounting 64 about which it pivots as shown by arrow A between a normal operating position shown in solid outline in FIG. 2 and a non-operating position shown in broken outline in FIG. 2 which is angularly displaced from the normal operating position about the pivot 64.

The movement of the backplate 62 between the normal operating position shown in solid outline in FIG. 2 and the non-operating position shown in broken outline in FIG. 2 is "balanced over center", whereby gravity renders both the normal operating position and the non-operating position stable. This feature is clearly illustrated in FIG. 2. In the normal operating position, the center of gravity of the backplate 62 and the structure to the right thereof supported thereby is clearly well to the right of the pivot 64, so that, when the apparatus is in the normal operating position, there is a clockwise moment exerted thereon by the earth's gravitational field. On the other hand, when the backplate 62 with the structure to the right thereof supported thereby is pivoted counterclockwise to the non-operating position shown in FIG. 2, the center of gravity of this structure is well to the left of the pivot 64, so that there is a counterclockwise moment about the pivot 64 due to the earth's gravitational field.

In order to effect movement between the normal operating position and the non-operating position, a power drive is provided, preferably a piston-cylinder assembly 66 shown in FIG. 2. The assembly 66 comprises a cylinder 68 within which is a piston (not shown) connected to a ram extension 70. The ram extension 70 is pivotally connected at 72 to a lug 74 connected to the backplate 62. The cylinder 68 is formed with a lug 76 at the end opposite the ram extension 70, the lug 76 being pivotally connected at 78 to a lug 80 rigidly connected to the frame 24, as by bolts 82.

Fluid lines 84 are connected to opposite ends of the cylinder 68, whereby a hydraulic fluid or a gas can be selectively admitted into the cylinder 68 on one side or the other of the piston. This actuates the piston-cylinder assembly 66 to pivot the backplate 62 and the structure to the right thereof towards either the operating or the non-operating position.

The drying module 47 (FIG. 1B) removes residual rinse water from the surfaces of the components by compressed-air wipe-off using a vertically adjustable manifold and positionally adjustable nozzles. More particularly, the drying module 47 includes a plurality of upper tubes 86 and lower tubes 88 connected to a manifold 90. A drying gas is introduced from the manifold 90 through the tubes 86 and 88 to the DIPs 12 from above and below as they pass through the drying module. The ends of at least the upper tubes 86 which are adjacent to the DIPs 12 are connected to and move with the backplate 62 as the backplate 62 pivots. Accordingly, at least the upper tubes 86, or the portions thereof adjacent to the DIPs 12, are made of a flexible material, so that they accommodate the pivoting movement of the backplate 62.

Similarly, in the first and second wash modules 44 and 46, flexible tubing (not shown) may be employed which is similar to the tubing 86 and 88 and likewise accommodates pivoting of the backplate 62. The wash modules 44 and 46 provide for water base washing (defluxing) and rinsing of the components utilizing high pressure spray manifolds.

As noted above, the endless chain 38 comprises a multiplicity of links. Each of the fingers 34 comprises a bent metal part having, in addition to the portion 36 which extends horizontally, a second portion 92 best shown in FIGS. 2 and 3 which extends vertically and is connected directly to one of the links of the chain 38.

In operation, any suitable supply means 94 (FIG. 1A), which may be conventional or not, supplies the DIPs 12 one-by-one to the apparatus 10, where they are deposited in the "live" position onto the lower track 28. The fingers 34 engage the DIPs, either singly or in groups of a few, and propel them along the path 32. The DIPs are constrained by the upper track 30 to follow the path 32 as they are propelled through the fluxer 48, solder pot 50, first wash module 44, second wash module 46, and drying module 47. The treatments effected at each of these stations are conventional per se. At the downstream end of the apparatus 10, the DIPs 12 are deposited into any suitable receiving apparatus 96, which may be conventional or not, wherein the DIPs are accumulated for further handling.

Thus there is provided in accordance with the invention novel and highly-effective apparatus for propelling electronic components and the like along a path where they receive various treatments. The apparatus solves the problems of the prior art noted above and enables a considerable saving resulting both from reduced labor costs and reduced machine downtime. Many modifications of the preferred embodiment of the invention disclosed herein will readily occur to those skilled in the art upon considering this disclosure. Accordingly, the invention is to be construed as including all structure which falls within the scope of the appended claims.

What is claimed is:

1. Apparatus for treating electronic components and the like, comprising:
    frame means,
    a lower track mounted on said frame means for supporting said components,
    an upper track mounted on said frame means in a normal operating position above and in spaced-apart parallel relation to said lower track, said lower and upper tracks defining therebetween a path along which said components can pass for treatment, a plurality of finger means each having a portion which extends substantially horizontally in such a manner as to be insertable between said tracks and engageable with individual ones of said components, and wherein said frame means comprises movable backplate means operatively associated with said finger means and at least one of said tracks for exposing said lower track, drive means mounted on said frame means for propelling said finger means, whereby said components are held captive between said lower and upper tracks and said finger means engage individual ones of said components and propel them along said path.

2. Apparatus as in claim 1 wherein said lower track has for at least a portion of its extent a substantially T-shaped cross section.

3. Apparatus as in claim 1 further comprising a wash section for washing said components and wherein said lower track has for at least a portion of its extent in said wash section a substantially T-shaped cross section.

4. Apparatus as in claim 1 further comprising a dry section for drying said components and wherein said lower track has for at least a portion of its extent in said dry section a substantially T-shaped cross section.

5. Apparatus as in claim 1 wherein said lower track has for at least a portion of its extent a substantially V-shaped cross section.

6. Apparatus as in claim 1 further comprising a flux section for fluxing said components and wherein said lower track has for at least a portion of its extent in said flux section a substantially V-shaped cross section.

7. Apparatus as in claim 1 further comprising a solder section for soldering said components and wherein said lower track has for at least a portion of its extent in said solder section a substantially V-shaped cross section.

8. Apparatus as in claim 1 further comprising adjustment means operatively associated with said frame means and at least one of said tracks for adjusting the separation between said tracks, whereby components of different thicknesses can be accommodated.

9. Apparatus as in claim 8 wherein said adjustment means comprises threaded means connected to said upper track and to said frame means, said threaded means comprising a thread defining a helix about a vertical axis, whereby turning of said threaded means effects adjustment of the elevation of said upper track.

10. Apparatus as in claim 8 wherein said adjustment means comprises a plurality of threaded means connected to said upper track and to said frame means at spaced-apart locations along said path, each of said threaded means comprising a thread defining a helix about a vertical axis, whereby turning of said threaded means effects a plurality of adjustments of the elevation of said upper track along the length thereof, said adjustments being to a degree independent of one another.

11. Apparatus for treating electronic components and the like, comprising:

frame means, a lower track mounted on said frame means for supporting said components, an upper track mounted on said frame means in a normal operating position above and in spaced-apart parallel relation to said lower track, said lower and upper tracks defining therebetween a path along which said components can pass for treatment, a plurality of finger means each having a portion which extends substantially horizontally in such a manner as to be insertable between said tracks and engageable with individual ones of said components, and drive means mounted on said frame means for propelling said finger means, whereby said components are held captive between said lower and upper tracks and said finger means engage individual ones of said components and propel them along said path, wherein said frame means comprises movable backplate means operatively associated with said finger means and at least one of said tracks for exposing said lower track, whereby said lower track can be cleaned or exchanged for another lower track having a different width or cross section.

12. Apparatus as in claim 11 wherein said backplate means supports said upper track, finger means and drive means and further comprising pivot means mounted said backplate means for pivotal movement between said normal operating position and a non-operating position angularly displaced therefrom about said pivot means.

13. Apparatus as in claim 12 constructed in such a manner that said movement is balanced over center, whereby gravity renders both said normal operating position and said non-operating position stable.

14. Apparatus as in claim 13 comprising power means for effecting said movement between said normal operating position and said non-operating position.

15. Apparatus as in claim 14 wherein said power means comprises a piston-cylinder assembly connected to said backplate means and said frame means.

16. Apparatus as in claim 11 further comprising tubing means operatively associated with said backplate means for supplying a fluid for treating said components, said tubing means being flexible to accommodate movement of said backplate means.

17. Apparatus as in claim 16 further comprising means operatively associated with said tubing means for supplying a washing liquid.

18. Apparatus as in claim 16 further comprising means operatively associated with said tubing means for supplying a drying gas.

19. Apparatus as in claim 1 wherein said drive means comprises an endless chain comprising a multiplicity of links and each of said finger means comprises a bent metal part having, in addition to said portion which extends substantially horizontally, a second portion which extends substantially vertically and is connected to at least one of said links.

20. Apparatus as in claim 1 further comprising a flux section for applying flux to said components.

21. Apparatus as in claim 20 further comprising means for heating said flux.

22. Apparatus as in claim 1 further comprising a solder section for applying molten solder to said components and a flux section upstream of said soldering section, said flux section applying heated flux to said components, thereby reducing thermal shock to said components in said solder section.

23. Apparatus as in claim 22 wherein said solder as applied to said components is at a temperature of substantially 450° F.–550° F.

24. Apparatus as in claim 22 wherein said flux as applied to said components is at a temperature of at least 160° F.

25. Apparatus as in claim 1 wherein said components are visible from a position beside said apparatus as they are propelled along said path.

* * * * *